(12) United States Patent
Kusano et al.

(10) Patent No.: US 7,679,184 B2
(45) Date of Patent: Mar. 16, 2010

(54) SEMICONDUCTOR DEVICE HAVING HIGH COOLING EFFICIENCY AND METHOD FOR MANUFACTURING THE SAME

(75) Inventors: Hidetoshi Kusano, Oita (JP); Kazuaki Yazawa, Chiba (JP)

(73) Assignee: Sony Computer Entertainment Inc., Tokyo (JP)

(*) Notice: Subject to any disclaimer, the term of this patent is extended or adjusted under 35 U.S.C. 154(b) by 141 days.

(21) Appl. No.: 11/751,694

(22) Filed: May 22, 2007

(65) Prior Publication Data

US 2007/0278667 A1 Dec. 6, 2007

(30) Foreign Application Priority Data

Jun. 2, 2006 (JP) ............... 2006-155232

(51) Int. Cl.
*H01L 23/34* (2006.01)

(52) U.S. Cl. ............... 257/714; 257/E23.097; 257/712

(58) Field of Classification Search ............ 257/712, 257/713, 714, 715, 716, 717, 787, 789, 796, 257/E23.097, E23.098
See application file for complete search history.

(56) References Cited

U.S. PATENT DOCUMENTS

| | | | |
|---|---|---|---|
| 6,535,388 B1 * | 3/2003 | Garcia | 361/704 |
| 2003/0067070 A1 * | 4/2003 | Kwon et al. | 257/706 |
| 2003/0085475 A1 * | 5/2003 | Im et al. | 257/796 |
| 2004/0169272 A1 * | 9/2004 | Hembree | 257/712 |
| 2004/0212080 A1 * | 10/2004 | Chen et al. | 257/712 |
| 2004/0229399 A1 * | 11/2004 | Chen et al. | 438/108 |

FOREIGN PATENT DOCUMENTS

JP 2001-257288 9/2001

* cited by examiner

*Primary Examiner*—Victor A Mandala
*Assistant Examiner*—Scott Stowe
(74) *Attorney, Agent, or Firm*—Katten Muchin Rosenman LLP (57) ABSTRACT

A semiconductor device includes a substrate, a semiconductor chip flip-chip mounted on the substrate, a sealing resin layer sealing the surroundings of the semiconductor chip, and a heat sink bonded to the sealing resin layer through a TIM layer. In addition, a cooling medium is encapsulated in an enclosed space formed on the rear surface of the semiconductor chip.

7 Claims, 8 Drawing Sheets

SEMICONDUCTOR DEVICE HAVING HIGH COOLING EFFICIENCY AND METHOD FOR MANUFACTURING THE SAME

BACKGROUND OF THE INVENTION

1. Field of the Invention

The present invention relates to a semiconductor device in which a semiconductor chip mounted on a substrate is sealed with a sealing resin and to a method for manufacturing the same.

2. Description of the Related Art

In recent years, the size of electronic devices such as computers, cellular phones, and PDAs (Personal Digital Assistances) has been reduced, and the functionality and speed thereof have increased. Accordingly, there is a demand for a further reduction in the size and a further increase in the speed and density of semiconductor devices on which a semiconductor chip, such as an IC (integrated circuit) or an LSI (large scale integrated circuit), for such electronic devices is mounted. The reduction in the size and increase in the speed and density of semiconductor devices has resulted in an increase in power consumption, and thus the amount of heat generated per unit volume tends to increase. Therefore, in order to ensure the operational stability of semiconductor devices, a technique for improving the heat dissipation characteristics of semiconductor devices must be employed.

A conventional semiconductor chip mounting structure is known where a semiconductor chip is flip-chip mounted by use of solder bumps, and the electrode-formed surface of the semiconductor chip is facing downward. For example, the technique shown in FIG. 8 of Japanese Patent Laid-Open Publication No. 2001-257288 is known as a technique for dissipating heat from a semiconductor device having a flip-chip mounted semiconductor chip. In this technique, a heat spreader is mounted on the rear surface of a semiconductor chip via a thermal interface material (hereinafter abbreviated as TIM) to thereby dissipate the heat generated by the semiconductor chip.

Meanwhile, in conjunction with the need for electronic devices on which a semiconductor device is mounted, the push to decrease the size and increase the speed and density of these semiconductor devices, which are the causes of the heat generation, continues. Therefore, there is a demand for even further improvement in the heat dissipation efficiency and stability of semiconductor devices.

RELATED ART LIST

Japanese Patent Laid-Open Publication No. 2001-257288

SUMMARY OF THE INVENTION

The present invention has been developed in view of the foregoing problems, and it is a general purpose of the invention to provide a semiconductor device in which the heat dissipation characteristics of a flip-chip mounted semiconductor chip can be improved.

One embodiment of the present invention relates to a semiconductor device. This semiconductor device includes: a substrate; a semiconductor chip which is mounted on the substrate with a front surface of the semiconductor chip facing downward; a sealing resin layer which seals the semiconductor chip; a cooling member which is bonded to an upper surface of the sealing resin layer; and a cooling medium which is encapsulated in an enclosed space formed between a lower surface of the cooling member and a rear surface of the semiconductor chip which is exposed on the sealing resin layer.

The cooling member may be a general heat sink in which projections and recesses are provided on the surface of a plate of metal such as copper or aluminum to increase the surface area. However, it should be appreciated that no limitation is imposed on the material and shape of the component of the cooling member so long as the component has high thermal conductivity and has a flat portion for bonding.

Another embodiment of the present invention relates to a method for manufacturing a semiconductor device. The method for manufacturing a semiconductor device includes: flip-chip mounting a semiconductor chip on a substrate, the substrate having a interconnect line pattern and a front surface of the semiconductor chip facing downward; forming a sealing resin layer which seals the semiconductor chip, where a rear surface of the semiconductor chip is exposed on the sealing resin layer; applying a bonding material to an upper surface of the sealing resin layer; placing a cooling member on an upper surface of the bonding material and bonding the cooling member to the upper surface thereof; injecting a cooling medium through an injection hole which is provided in the cooling member and is in communication with an enclosed space formed between the rear surface of the semiconductor chip and a lower surface of the cooling member; and filling the injection hole with a sealing material.

In this instance, in addition to generally used bonding agents, any material capable of bonding the sealing resin to the cooling member may be employed as the bonding material. The bonding material may be selected as appropriate in view of the sealing resin material, the material for the cooling member, and the like. For example, the bonding material may be a heat conductive paste such as a TIM or silicon grease or may be indium (In) or gold (Au). Any material may be used as the sealing material so long as it has both water resistance and good sealing properties. For example, a resin or metal may be used. When the injection hole is filled, such a material may, for example, be embedded in or applied to the injection hole.

Arbitrary combinations of the aforementioned constituting elements may fall within the scope of the invention receiving patent protection under the present patent application.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Hereinafter, embodiments of the present invention are described with reference to the drawings.

First Embodiment

Figure 1A:
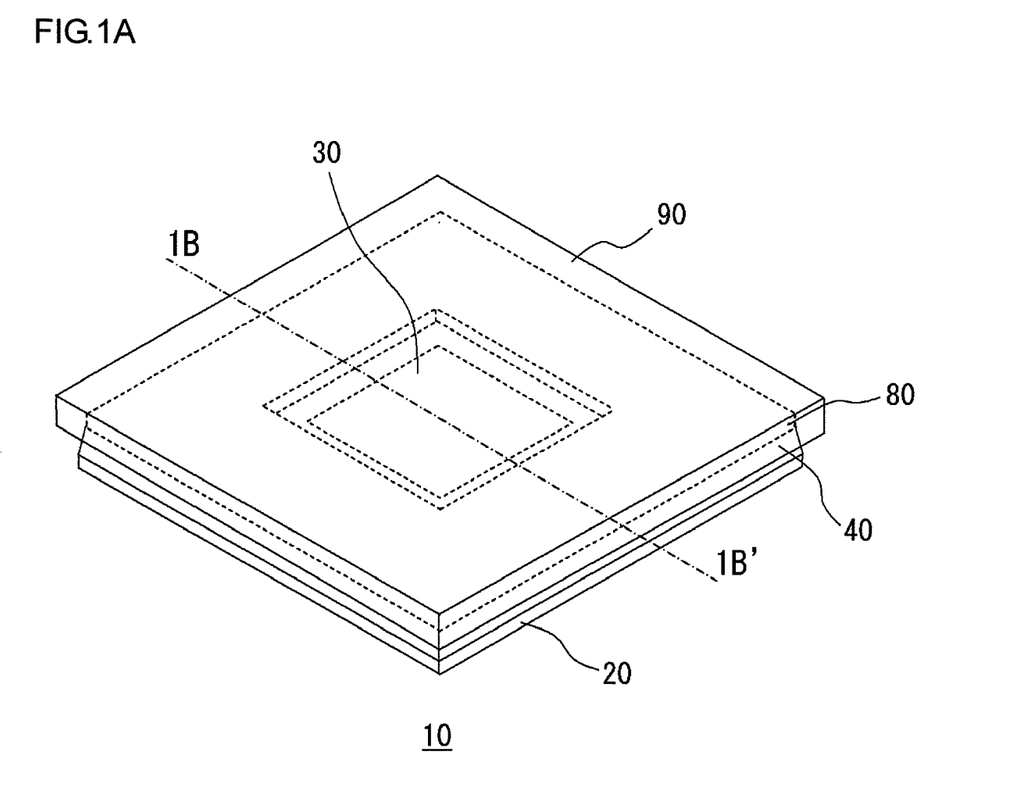
FIG. 1A is a perspective view showing the schematic configuration of a semiconductor device according to a first embodiment.
Figure 1B:
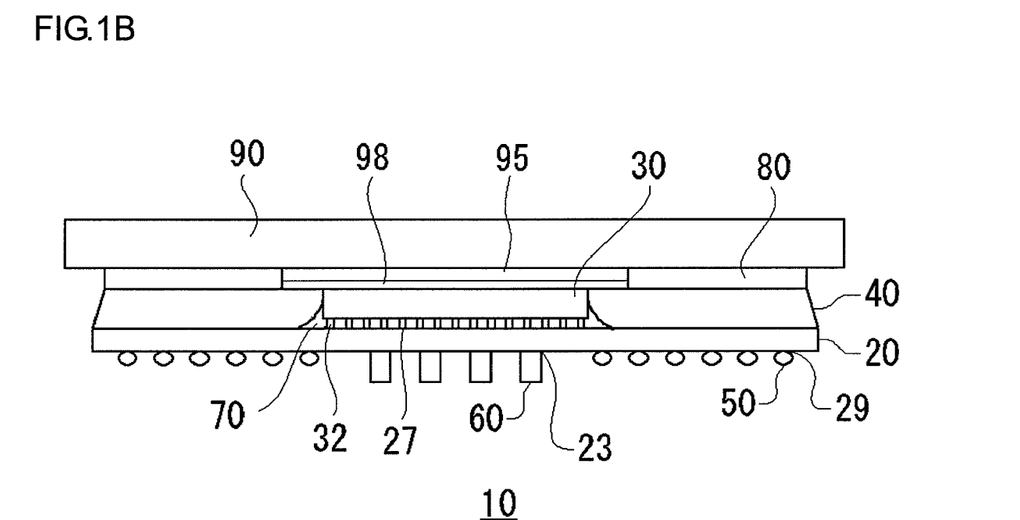
FIG. 1B is a cross-sectional view showing a cross-sectional structure taken along the line 1B-1B' in FIG. 1A.

FIG. 1A is a perspective view showing the schematic configuration of a semiconductor device 10 according to a first embodiment. FIG. 1B is a cross-sectional view showing a cross-sectional structure taken along the line 1B-1B' in FIG. 1A. The semiconductor device 10 includes: a substrate 20; a semiconductor chip 30 which is flip-chip mounted on the substrate 20 with the front surface of the chip 30 facing downward; a sealing resin layer 40 which seals the surroundings of the semiconductor chip 30; and a heat sink 90 which is bonded to the sealing resin layer 40 through a TIM layer 80. The semiconductor device 10 of this embodiment has a BGA (Ball Grid Array) type semiconductor package structure in which a plurality of solder balls 50 are arranged in an array on the rear surface of the substrate 20.

The semiconductor device 10 according to this embodiment has an enclosed space 95 which is surrounded by the TIM layer 80 and is provided between the lower surface of the heat sink 90 and the rear surface of the semiconductor chip 30 (i.e., the upper side of the semiconductor chip 30 shown in FIG. 1B). In the configuration of the semiconductor device 10, a cooling medium 98 is sealed in the enclosed space 95 to thereby improve the cooling efficiency of the semiconductor device 10.

Figure 2:
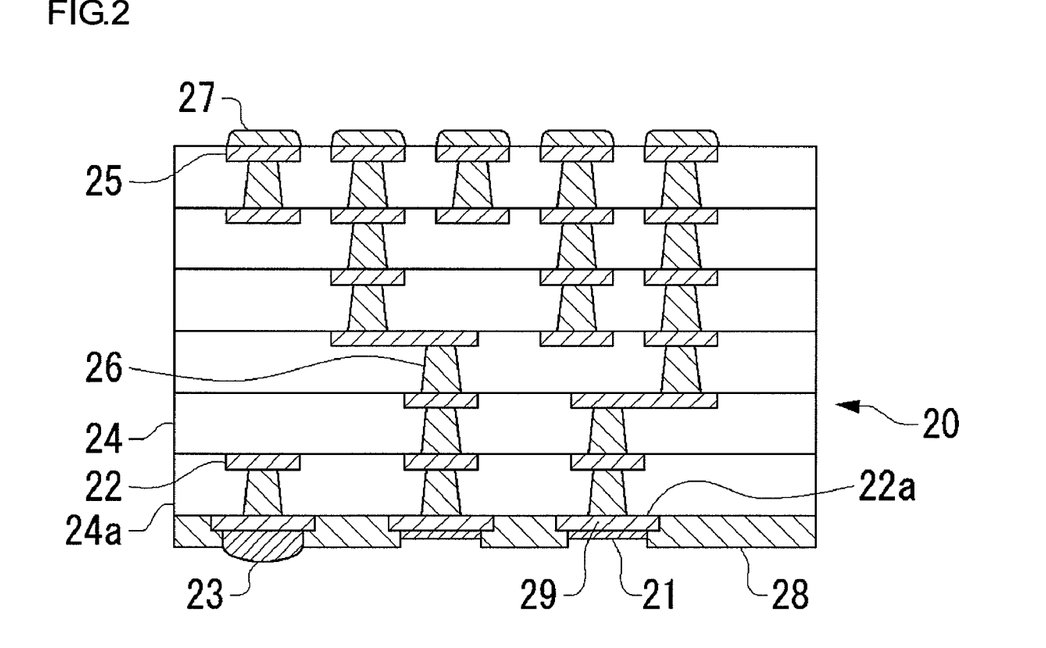
FIG. 2 is a cross-sectional view showing, in more detail, the structure of a substrate of the first embodiment.

The substrate 20 of this embodiment has a multilevel interconnection structure in which interlayer insulating films and interconnection layers are alternatively stacked. FIG. 2 is a cross-sectional view showing the structure of the substrate 20 in more detail. A plurality of interconnection layers 22 is stacked with an interlayer insulating film 24 interposed therebetween. Copper, for example, is employed to form the interconnection layers 22. The interconnection layers 22 of different levels are electrically connected by a via plug 26 provided in the interlayer insulating film 24. A solder resist film 28 composed of a resin material with excellent thermal resistance is formed around the interconnection layers 22a on the rear surface of the substrate 20. Hence, the lowermost interlayer insulating film 24a is coated with the solder resist film 28 such that the solder is prevented from sticking to areas other than those areas desired when the substrate 20 is subjected to soldering. Further, a plurality of ball lands 29 to which the solder balls 50 are bonded is arranged in an array on the rear surface of the substrate 20. Each surface of the ball lands 29 is coated by an organic surface protection (OSP) coating material 21. Moreover, an electrode pad 23 made of tin (Sn), silver (Ag), or copper (Cu), or an alloy thereof is formed in the electrode portions on which a capacitor 60 is mounted. Additionally, a plurality of electrode pads 25 made of nickel (Ni), lead (Pb), or gold (Au), or an alloy thereof, formed by electrolytic plating, is arranged in an array on the front surface of the substrate 20 on which the semiconductor chip is mounted. On each of the electrode pads 25 a C4 (Controlled Collapse Chip Connection) bump 27 made of tin or lead, or an alloy thereof is provided.

As detailed above, the substrate 20 of this embodiment is a coreless substrate, and thus the thickness thereof can be reduced to, for example, approximately 300 μm in a six-layer structure. By reducing the thickness of the substrate 20, the line resistance is reduced, and thus an increase in the operation speed of the semiconductor device 10 can be achieved.

Returning to FIGS. 1A and 1B, each of the solder balls 50 is bonded to each of the ball lands 29 provided on the rear surface of the substrate 20. The capacitors 60 are mounted on the electrode pads 23 provided on the rear surface of the substrate 20.

On the front surface of the substrate 20 is a flip-chip mounted semiconductor chip 30 such as an LSI with the front surface of the chip 30 facing downward. More specifically, each of solder bumps 32 serving as external electrodes of the semiconductor chip 30 is soldered to each of the C4 bumps 27 of the substrate 20. The gap between the semiconductor chip 30 and the substrate 20 is filled with an underfill 70. In this manner, the stress on the C4 bump 27, which is generated by the fluctuation in the gap between the substrate 20 and the semiconductor chip 30 due to the thermal expansion during the temperature cycle, can be suppressed.

The sealing resin layer 40 is formed around the semiconductor chip 30, sealing it. In the present embodiment, all the side surfaces of the semiconductor chip 30 are sealed with the sealing resin layer 40, and the height of the upper surface of the sealing resin layer 40 is the same as the height of the rear surface of the semiconductor chip 30. Hence, the sealing condition on the side surfaces of the semiconductor chip 30 is improved, and thus the semiconductor chip 30 is more reliably protected.

A TIM layer 80 having a predetermined thickness is formed on the upper surface of the sealing resin layer 40. However, the TIM layer 80 is not formed on the rear surface of the semiconductor chip 30, or on a region of the sealing resin layer 40 which is located around the rear surface of the semiconductor chip 30 and has a predetermined width. The heat sink 90 is bonded to the sealing resin layer 40 through the TIM layer 80. Therefore, the enclosed space 95 is formed by: the rear surface of the semiconductor chip 30 and the sealing resin layer 40 around the chip 30 each of which serves to form the bottom surface; the TIM layer 80 which serves to form the side surfaces; and the heat sink 90 which serves to form the upper surface. The cooling medium 98 is encapsulated in the enclosed space 95.

The cooling medium 98 is selected from among generally used liquid cooling mediums such as water, acetone, or ethanol, as appropriate. An alternative fluorocarbon such as an HCFC (hydrochlorofluorocarbon) or an HFC (hydrofluorocarbon) such as HFC-32, HFC-125, or HFC-134a, butane, or methane may also be used as the cooling medium 98. During the operation of the semiconductor device 10, the cooling medium 98 is heated by the heat generate on the rear surface of the semiconductor chip 30, and a part thereof is vaporized and diffuses. When the diffusing cooling medium 98 reaches the heat sink 90, the cooling medium 98 is cooled and liquefied, and the liquefied cooling medium 98 returns to the rear surface of the semiconductor chip 30. Thus, the heat generated on the rear surface of the semiconductor chip 30 is transferred efficiently to the heat sink 90 through the circulation of the cooling medium 98. Since the area of the bottom surface of the enclosed space 95 is larger than that of the rear surface of the semiconductor chip 30, the heat is uniformly transferred from the entire rear surface of the semiconductor chip 30 via the cooling medium 98. Therefore, the rear surface of the semiconductor chip 30 is cooled uniformly, and as such, the operational stability of the semiconductor chip 30 is improved.

It is desired that the sealing resin layer 40 cover the substrate 20 in a way where positions corresponding to positions located outside the outermost solder balls 50 of the plurality of the solder balls 50 arranged in an array are also covered. In this manner, the strength of the substrate 20 is improved through the sealing resin layer 40, and thus the likelihood of warpage of the substrate 20 is suppressed. Hence, the sealing resin layer 40 also serves as a reinforcing material of the substrate 20, and thus the strength of the entire semiconductor device 10 can be ensured even when the thickness of the substrate 20 is further reduced.

The capacitors 60 are connected within a portion of the rear surface of the substrate 20, which is located directly below the semiconductor chip 30. Hence, the line path from the semiconductor chip 30 to the capacitors 60 can be reduced, and as such, a reduction in line resistance can be achieved. In this instance, the placement position of the capacitors 60 is not limited to the portion of the rear surface of the substrate 20 which is located directly below the semiconductor chip 30. For example, the capacitors 60 may be placed in positions on the rear surface of the substrate 20 which are displaced from the positions being directly below the semiconductor chip 30 so long as the line path can be reduced sufficiently. Alternatively, within the range in which the line path can be reduced sufficiently, the capacitors 60 may be placed on the front surface of the substrate 20 and may be sealed within the sealing resin layer 40.

(Method for Manufacturing Semiconductor Device)

Figure 3:
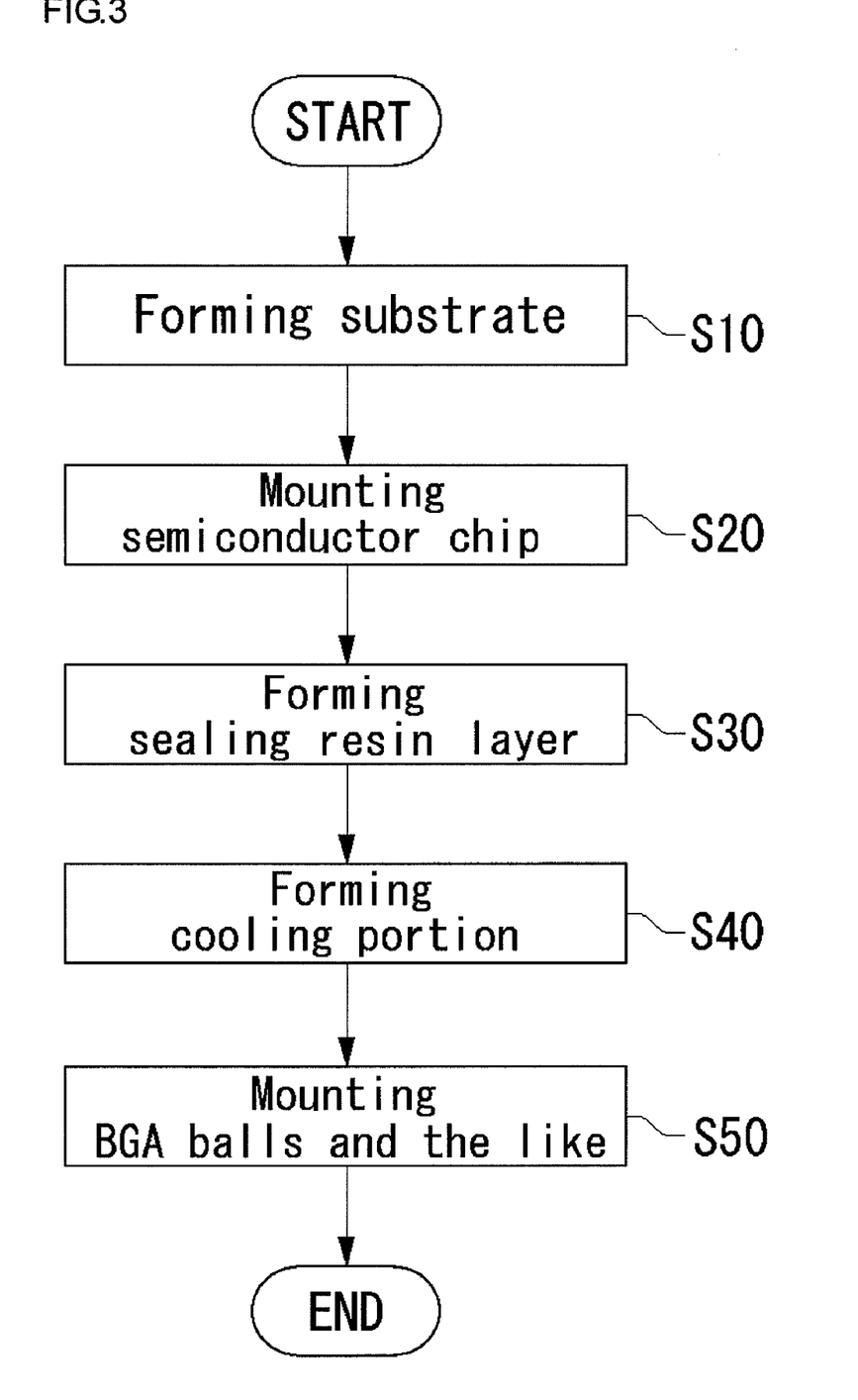
FIG. 3 is a flowchart showing the outline of a method for manufacturing the semiconductor device of the first embodiment.

FIG. 3 is a flowchart showing the outline of a method for manufacturing the semiconductor device of the first embodiment. First, a substrate having a multilevel interconnection structure is formed (S10), and a semiconductor chip is mounted on the substrate (S20). Subsequently, the semiconductor chip is sealed with a sealing resin (S30). A cooling portion formed from the enclosed space 95 and the cooling medium 98 is formed on the rear surface of the semiconductor chip (S40). Finally, solder balls, capacitors, and the like are mounted on the rear surface of the substrate (S50).

When the substrate is formed (S10), the multilevel interconnection structure shown in FIG. 2 is formed by means of a generally used method. Similarly, in S50, the solder balls and capacitors may be mounted by means of a general method. Hereinafter, a detailed description will now be given of the method for mounting the semiconductor device (S20), the method for forming the sealing resin layer (S30), and the method for forming the cooling portion (S40).

(1. Method for Mounting Semiconductor Chip)

Figure 4A:
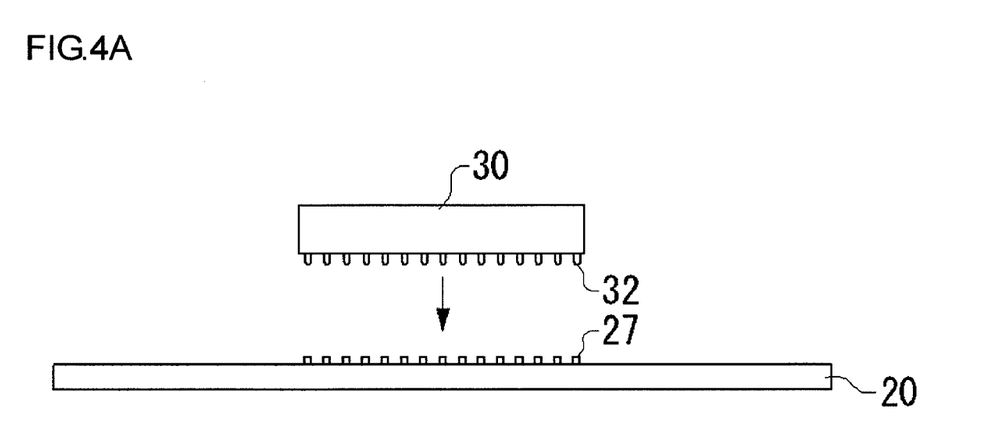
FIGS. 4A and 4B are cross-sectional diagrams showing a process in accordance with a method for mounting a semiconductor chip of the semiconductor device of the first embodiment.
Figure 4B:
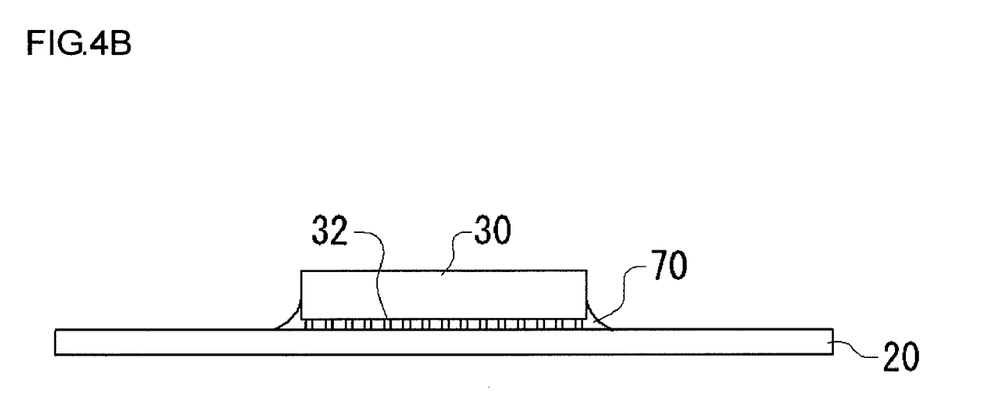

FIGS. 4A and 4B are a series of cross-sectional diagrams showing the method for mounting the semiconductor chip 30 of the semiconductor device 10 of the first embodiment.

First, as shown in FIG. 4A, each of the solder bumps 32 is soldered to the corresponding C4 bumps 27 with the external electrode terminal-mounted surface of the semiconductor chip 30 facing downward, and as such, the semiconductor chip 30 is flip-chip mounted.

Subsequently, as shown in FIG. 4B, the underfill 70 is filled in the gap between the semiconductor chip 30 and the substrate 20.

By following the above steps, the semiconductor chip 30 is flip-chip mounted on the substrate 20 with the stress generated in the solder bonding portions dispersed through the underfill 70.

(2. Method for Forming Sealing Resin Layer)

FIGS. 5A to 5C, 6A, and 6B are a series of diagrams showing the method for forming the sealing resin layer 40 of the semiconductor device 10 of the first embodiment.

First, a description will be given of the configuration of an upper mold 200a and a lower mold 210 employed in the method for forming the sealing resin layer. The upper mold 200a has a runner 202 serving as a flow passage of the molten sealing resin. The runner 202 has an opening which opens into a cavity 220 which is formed when the upper mold 200a and the lower mold 210 are brought together. The molding surface 206 of the upper mold 200a comes into contact with the rear surface of the semiconductor chip 30 during resin molding, and the sealing resin layer 40 is molded around the semiconductor chip 30. Furthermore, in the upper mold 200a, a suction hole 204 is provided which is in communication with a suction mechanism such as a pump.

Additionally, the lower mold 210 has a pot 214 in which a plunger 212 is provided so as to be reciprocally movable.

Figure 5A:
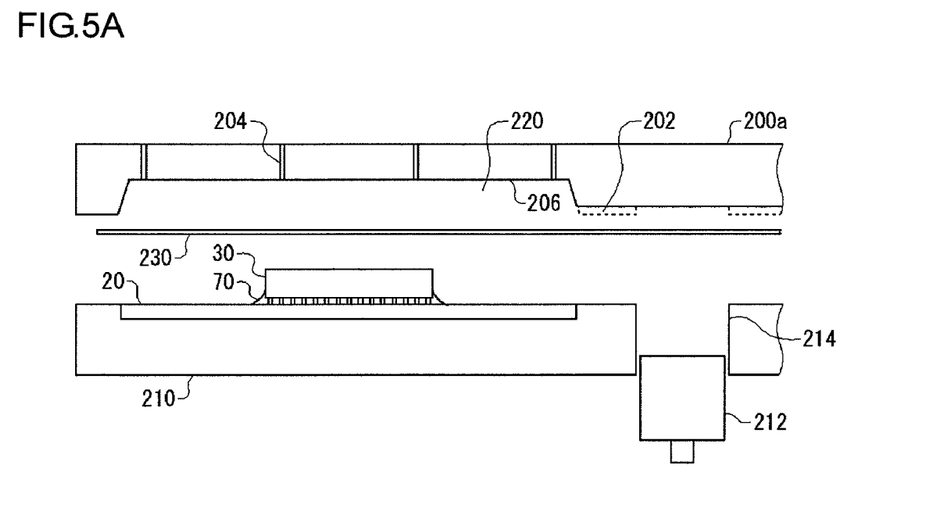
FIGS. 5A to 5C are process diagrams showing a method for forming a sealing resin layer of the semiconductor device of the first embodiment.

The upper mold 200a and the lower mold 210 described above are used, and the substrate 20 having the semiconductor chip 30 mounted thereon is placed on the lower mold 210 as shown in FIG. 5A. In addition to this, a release film 230 is placed between the upper mold 200a and the lower mold 210.

Figure 5B:
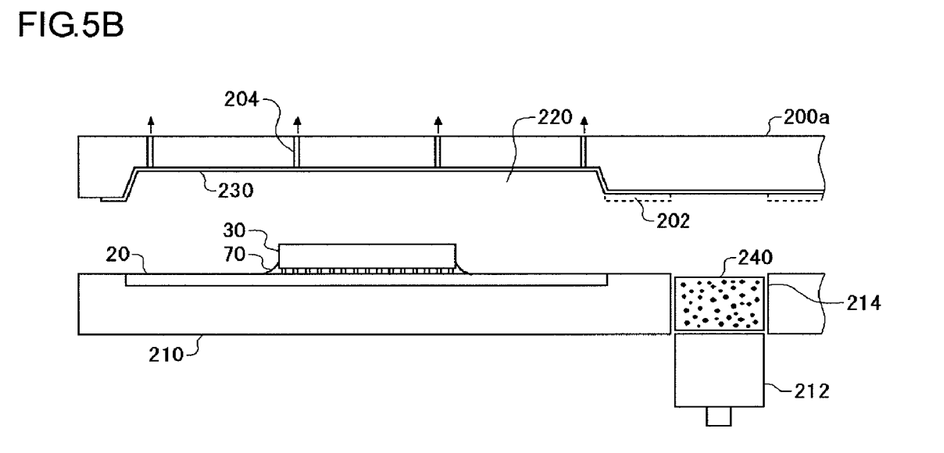

Next, as shown in FIG. 5B, a resin tablet 240 formed by solidifying a sealing resin is charged into the pot 214. The air between the release film 230 and the upper mold 200a is then evacuated by operating the suction mechanism to thereby bring the release film 230 into intimate contact with the upper mold 200a. As the release film 230 is employed, the sealing resin layer 40 can be molded such that a sealing resin 241 to be filled later is prevented from contacting the inner surface of the cavity 220 or contacting other portions. Therefore, the upper mold 200a is not required to be cleaned, and as such an improvement in productivity and a reduction in manufacturing costs can be achieved.

Figure 5C:
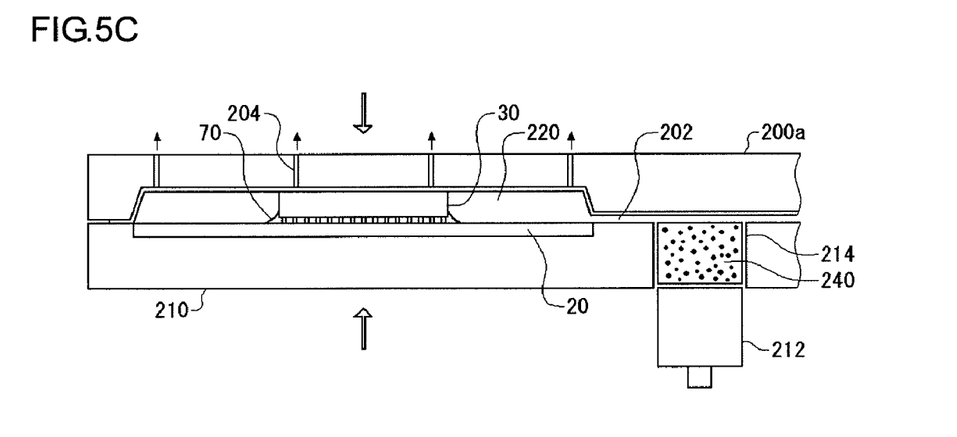

Next, as shown in FIG. 5C, the upper mold 200a and the lower mold 210 are clamped together.

Figure 6A:
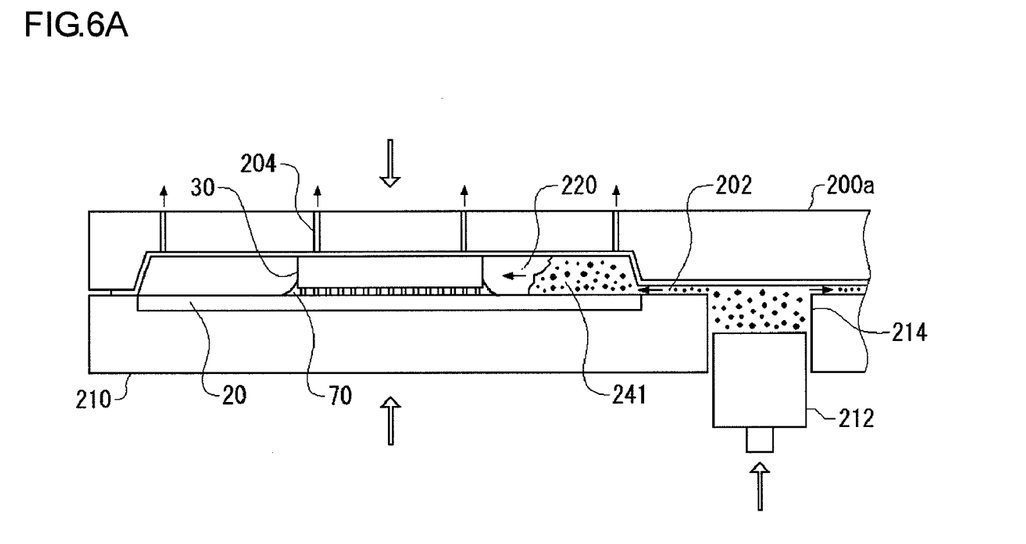
FIGS. 6A and 6B are process diagrams showing the method for forming the sealing resin layer of the semiconductor device of the first embodiment.

Subsequently, as shown in FIG. 6A, the resin tablet 240 is heated and melted, and the plunger 212 is pressed into the pot 214 to thereby introduce the liquefied sealing resin 241 in the cavity 220. After the space formed between the upper mold 200a and the substrate 20 is filled with the sealing resin 241, heat treatment is performed for a predetermined period of time to thereby solidify the sealing resin 241.

Figure 6B:
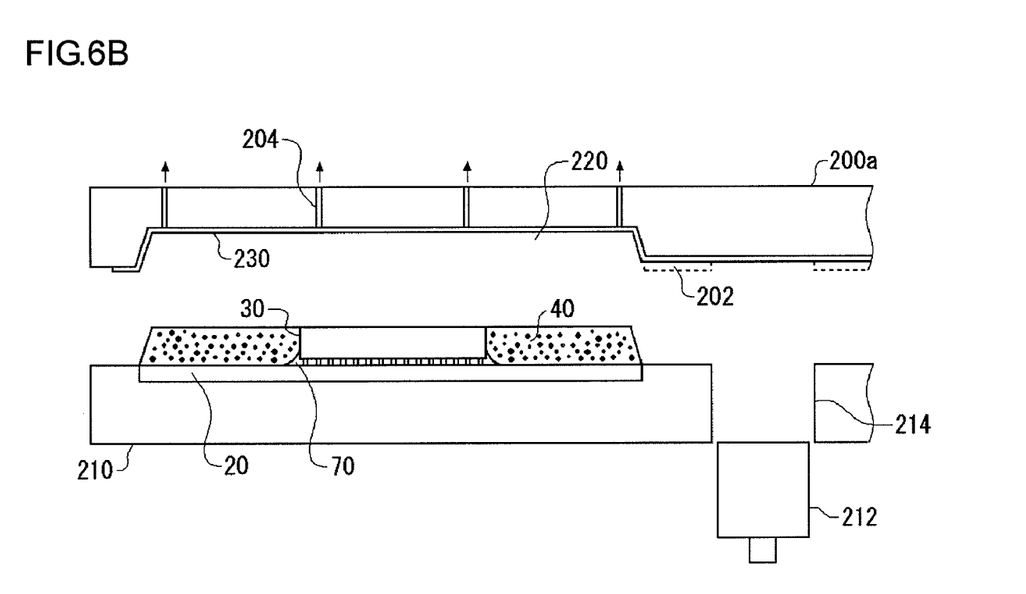

Next, as shown in FIG. 6B, the upper mold 200a is removed from the lower mold 210, and the substrate 20 having the sealing resin layer 40 formed thereon is removed.

(3. Method for Forming Cooling Portion)

FIG. 7 is a series of diagrams showing the method for forming the cooling portion of the semiconductor device 10 of the first embodiment.

Figure 7A:
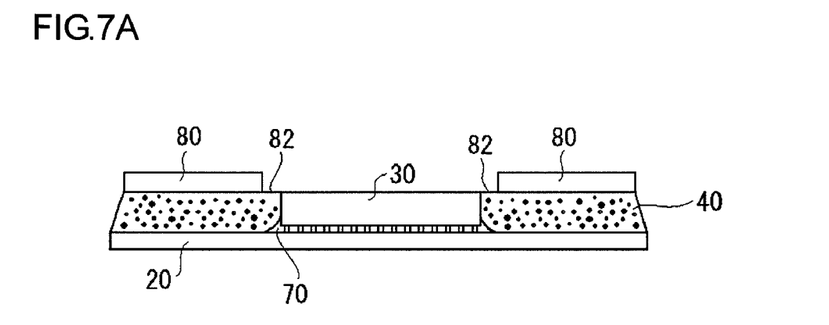
FIGS. 7A to 7D are process diagrams showing a method for forming a cooling portion of the semiconductor device of the first embodiment.

First, as shown in FIG. 7A, the TIM layer 80 is formed on the upper surface of the sealing resin layer 40. The TIM layer 80 is not formed on the rear surface of the semiconductor chip 30 and on an upper surface 82 of the sealing resin layer 40 which is located around the rear surface of the semiconductor chip 30 and has a predetermined width. Therefore, after these portions are masked, the TIM is applied, and the mask is then subsequently removed. Alternatively, a separately molded TIM layer may be pressure-bonded to the sealing resin layer 40.

Figure 7B:
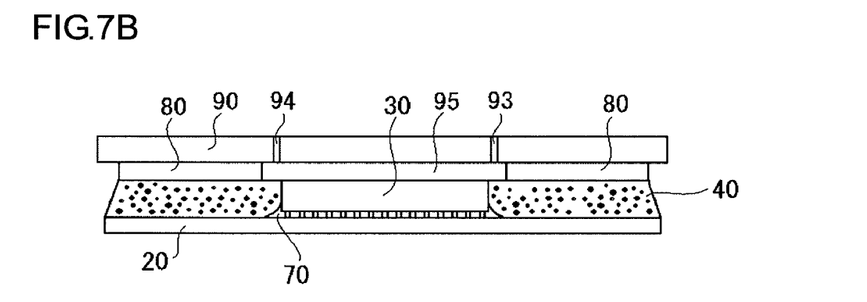

Next, as shown in FIG. 7B, the heat sink 90 is placed on the upper surface of the TIM layer 80 and is bonded thereto. The heat sink 90 is provided with a cooling medium injection hole 93 and a depressuring suction hole 94 each of which, when the heat sink is mounted, is in communication with the enclosed space 95 formed by the heat sink 90, the semiconductor chip 30, the sealing resin layer 40 around the chip 30, and the TIM layer 80.

Figure 7C:
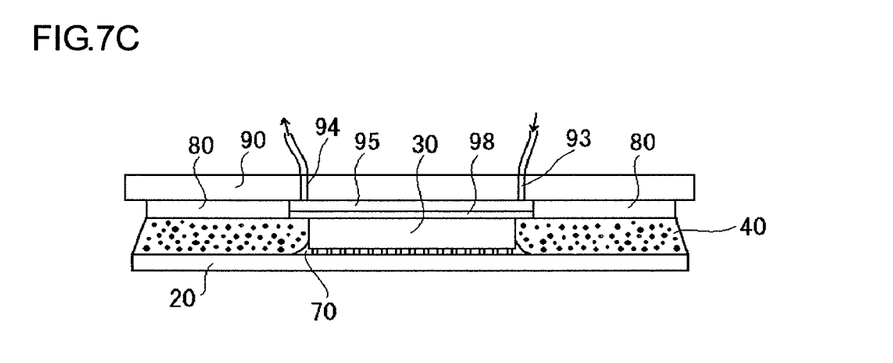

Next, a container containing the cooling medium 98 is connected to the cooling medium injection hole 93, and a suction mechanism such as a pump is connected to the depressuring suction hole 94. Then, as shown in FIG. 7C, air is sucked through the depressuring suction hole 94 to reduce the pressure in the enclosed space 95, whereby the cooling medium 98 is injected through the cooling medium injection hole 93. However, the method for injecting the cooling medium 98 is not limited to that detailed above. For example, a container containing the cooling medium 98 may be pressurized to feed the cooling medium 98 into the enclosed space 95.

Figure 7D:
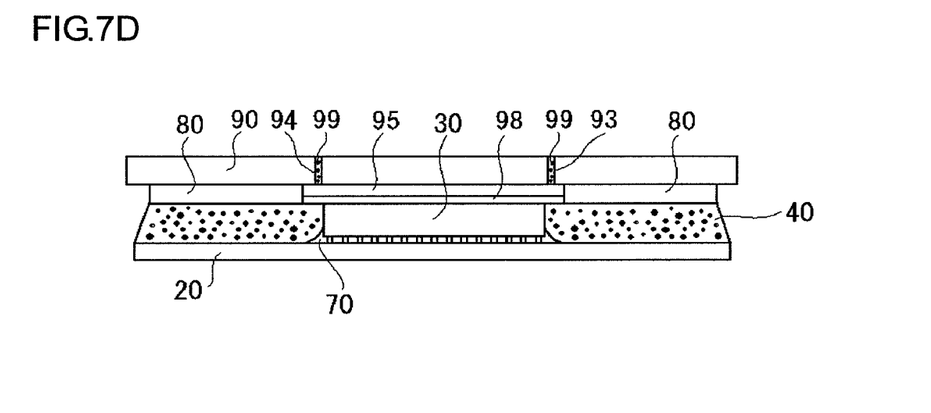

Next, as shown in FIG. 7D, the cooling medium injection hole 93 and the depressuring suction hole 94 are filled with a sealing material such as a resin. The sealing resin which forms the sealing resin layer 40 may be used as the sealing material 99 which is used for filling the cooling medium injection hole 93 and the like. In this case, the heated and semi-liquefied sealing resin is squeezed into the cooling medium injection hole 93 and the like and then is cooled and solidified. Hence, the cooling medium 98 is encapsulated in the enclosed space 95.

When the cooling medium injection hole 93 and the depressuring suction hole 94 are filled with the sealing material, these holes may be filled while air is being sucked through the depressuring suction hole 94 in order to reduce the pressure in the enclosed space 95. In this case, the internal pressure of the enclosed space 95 is lower than atmospheric pressure. Thus, when the temperature on the rear surface of the semiconductor chip 30 is increased due to the operation of the semiconductor device 10, the vaporization of the cooling medium 98 is more readily facilitated. Therefore, the above-described circulation mechanism of the cooling medium 98 is more readily facilitated, and thus the cooling efficiency of the semiconductor chip 30 is improved.

When the semiconductor device 10 is operated, the pressure inside the enclosed space 95 is increased due to the volume change corresponding to the vaporization of the cooling medium 98. Hence, the internal pressure of the enclosed space 95 when the cooling medium injection hole 93 and the like are filled and the amount of the cooling medium 98 are determined by calculations or experiments in advance so that the maximum internal pressure when all the cooling medium 98 is vaporized is lower than the withstand pressure of the enclosed space 95. The amount of the liquid cooling medium 98 is typically approximately 10 to several hundreds mm$^3$. However, the amount may be changed as appropriate according to the capacity of the enclosed space 95.

In the method for forming the cooling portion as described above, before the heat sink 90 is mounted, the rear surface of the semiconductor chip 30 and a portion of the surface of the heat sink 90 which forms the enclosed space 95 may be subjected to surface modification processing to form fine projections and recesses thereon. In this case, capillary action occurs in the processed surfaces, and thus the cooling medium 98 enters the recesses. Therefore, the effective cooling area increases to improve the cooling efficiency of the semiconductor chip 30. For example, laser marks may be used as the surface modification. Furthermore, the same effect can be obtained by subjecting the surfaces to porous plating.

In the above-described embodiment, the enclosed space 95 surrounded by the TIM layer 80 and the heat sink 90 is formed on the rear surface of the semiconductor chip 30, and the cooling medium 98 is encapsulated therein. Thus, the cooling medium 98 is vaporized to transfer heat to the heat sink 90, whereby the heat can be efficiently and uniformly dissipated from the entire rear surface of the semiconductor chip 30. Furthermore, the improvement of the heat dissipation efficiency obtained in this embodiment can also be achieved by use of a low cost heat sink. Therefore, manufacturing costs can be reduced as compared with the case where a heat spreader is used.

Second Embodiment

Figure 8:
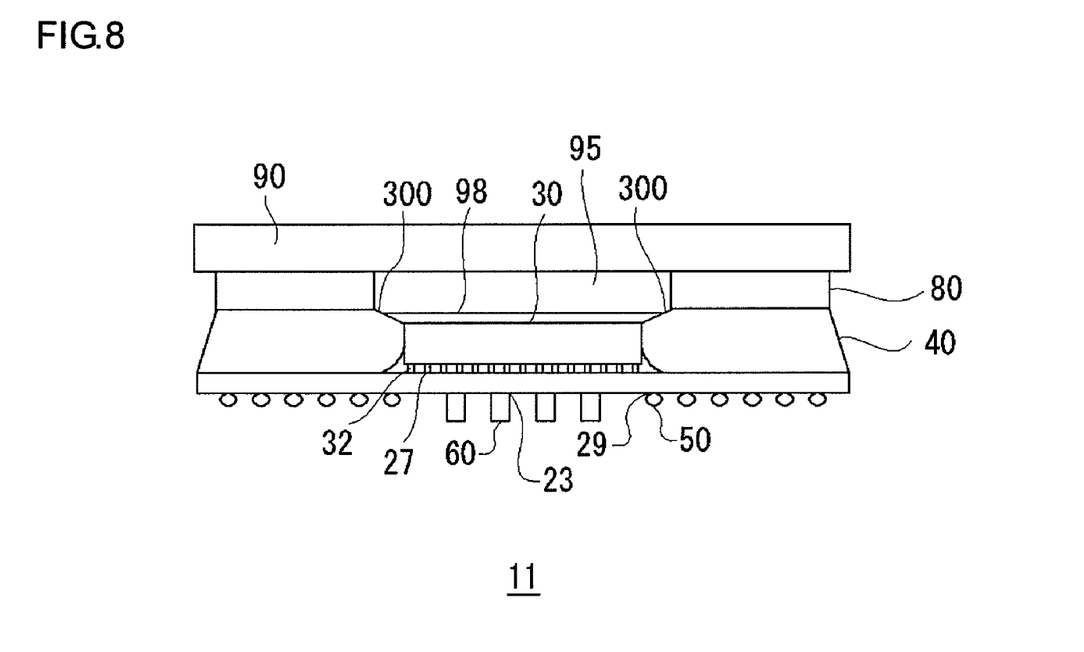
FIG. 8 is a cross-sectional view showing the cross-sectional structure of a semiconductor device according to a second embodiment.

FIG. 8 shows the cross-sectional structure of a semiconductor device 11 according to a second embodiment. In the description of the semiconductor device 11 according to the second embodiment, the description of the configurations that are the same as those of the semiconductor device 10 according to the first embodiment is appropriately omitted, and the configurations that are different from those of the semiconductor device 10 according to the first embodiment are described below.

The sealing resin layer 40 in the semiconductor device 11 is provided with a tapered portion 300 extending from the outer periphery of the rear surface of the semiconductor chip 30 flip-chip mounted on the substrate 20 to the upper surface of the sealing resin layer 40. The tapered portion 300 has a predetermined width and is inclined with respect to the upper surface of the sealing resin layer 40. Specifically, the difference between the present embodiment and the first embodiment is that the rear surface of the semiconductor chip 30 and the horizontal surface of the sealing resin layer 40 do not form a single flat surface, i.e., the rear surface of the semiconductor chip 30 is positioned lower than the level of the horizontal portion of the sealing resin layer 40.

In this case, the TIM layer 80 is formed, for example, on a horizontal portion (excluding the tapered portion 300) of the upper surface of the sealing resin layer 40. The heat sink 90 is mounted on the TIM layer 80 to thereby form the enclosed space 95 surrounded by the rear surface of the semiconductor chip 30, the tapered portion 300 of the sealing resin layer 40, the side surfaces of the TIM layer 80, and the lower surface of the heat sink 90. Here, the encapsulating amount of the cooling medium 98 is adjusted such that the upper surface of the cooling medium 98 is lower than the level of the horizontal portion of the sealing resin layer 40. In this manner, when the semiconductor device 11 is placed horizontally, the liquid cooling medium 98 is prevented from contacting the TIM layer 80. Therefore, the occurrence of problems such as the modification of the TIM layer 80 due to contact with the cooling medium 98 and the intrusion of the cooling medium 98 into the interface between the sealing resin layer 40 and the TIM layer 80 can be prevented. Hence, the heat dissipation efficiency of the semiconductor device 11 can be more safely and stably improved.

The method for manufacturing the semiconductor device 11 according to the second embodiment is the same as that of the first embodiment. However, in the method for manufacturing the semiconductor device 11 according to the second embodiment, an upper mold 200 provided with a molding surface 206 having a tapered shape extending from the surface contacting the semiconductor chip 30 is employed in the sealing resin layer forming the step shown in FIGS. 5A to 5C, 6A, and 6B.

It should be appreciated that the present invention is not limited to the embodiments described above. Various modifications such as changes in design may be made based on the knowledge of those skilled in the art, and such modified embodiments may fall within the scope of the present invention.

For example, in each of the above-described embodiments, the substrate 20 has a coreless multilevel interconnection structure. However, the technical idea of the present invention is applicable to a multilevel interconnection substrate having a core.

Furthermore, in each of the above-described embodiments, a BGA type semiconductor package is employed, but the invention is not limited thereto. For example, a PGA (Pin Grid Array) type semiconductor package having pin-shaped lead terminals or an LGA (Land Grid Array) type semiconductor package having electrodes arranged in an array may also be employed.

Moreover, the method for manufacturing the semiconductor device of each of the embodiments is not limited to the method in which the release film is used as described above. For example, the semiconductor device of each of the embodiments may be manufactured by means of a well-known transfer molding method in which a release film is not used.

Furthermore, in each of the above-described embodiments, the sealing resin layer 40 is bonded to the heat sink 90 by the formation of the TIM layer 80. However, when a material different from the TIM is used as the bonding material, the surface thereof which comes in contact with the sealing resin layer 40 or the heat sink 90 may be subjected to treatment in order to improve thermal contact, depending on the material used, and the material may then be used for bonding. In this manner, the same effects as those of the present embodiments can be obtained by using a bonding material selected from various materials in view of cost and required performance.

What is claimed is:

1. A semiconductor device comprising:
   a substrate;
   a semiconductor chip which is mounted on the substrate with a front surface of the semiconductor chip facing downward;
   a sealing resin layer which seals the semiconductor chip;
   a cooling member which is bonded to an upper surface of the sealing resin layer;
   a cavity enclosed by at least a lower surface of the cooling member and a rear surface of the semiconductor chip which is exposed on the sealing resin layer; and
   a liquid cooling medium which is encapsulated in the cavity, wherein
   the rear surface of the semiconductor chip is positioned lower than an uppermost surface of the sealing resin layer and wherein at least a part of the upper surface of the sealing resin layer is inclined toward the rear surface of the semiconductor chip, and
   an upper surface of the liquid cooling medium is positioned lower than a level of the uppermost surface of the sealing resin layer when the semiconductor device is horizontally placed.

2. The semiconductor device according to claim 1, further comprising a thermal interface material layer which bonds the sealing resin layer to the cooling member and is provided on the upper surface of the sealing resin layer.

3. The semiconductor device according to claim 1, wherein water serving as the liquid cooling medium is encapsulated in the cavity.

4. The semiconductor device according to claim 1, wherein the internal pressure of the cavity is lower than atmospheric pressure when the semiconductor device is not operated.

5. The semiconductor device according to claim 1, wherein at least one of the rear surface of the semiconductor chip and a portion of the lower surface of the cooling member, each of which is included in an inner wall of the cavity, is subjected to surface modification.

6. The semiconductor device according to claim 1, wherein at least one of the rear surface of the semiconductor chip and a portion of the lower surface of the cooling member, each of which is included in an inner wall of the cavity, is subjected to porous plating processing.

7. A semiconductor device comprising:
   a substrate;
   a semiconductor chip which is mounted on the substrate with a front surface of the semiconductor chip facing downward;
   a sealing resin layer which seals the semiconductor chip;
   a cooling member which is bonded to an upper surface of the sealing resin layer;
   a cavity enclosed by at least a lower surface of the cooling member and a rear surface of the semiconductor chip which is exposed on the sealing resin layer; and
   a liquid cooling medium which is encapsulated in the cavity, wherein a bottom surface of the cavity includes the rear surface of the semiconductor chip and a part of the upper surface of the sealing resin layer which is located around the rear surface of the semiconductor chip.

* * * * *

UNITED STATES PATENT AND TRADEMARK OFFICE
CERTIFICATE OF CORRECTION

PATENT NO. : 7,679,184 B2
APPLICATION NO. : 11/751694
DATED : March 16, 2010
INVENTOR(S) : Hidetoshi Kusano et al.

It is certified that error appears in the above-identified patent and that said Letters Patent is hereby corrected as shown below:

Title page, item (73) should read as follows:

(73) Assignees: Sony Corporation, Tokyo (JP)
Sony Computer Entertainment, Inc., Tokyo (JP)

Signed and Sealed this

Thirteenth Day of July, 2010

David J. Kappos
*Director of the United States Patent and Trademark Office*